(12) United States Patent
Gaul et al.

(10) Patent No.: US 10,448,538 B1
(45) Date of Patent: Oct. 15, 2019

(54) APPARATUSES, SYSTEMS, AND METHODS FOR COOLING WIRELESS ROUTERS

(71) Applicant: Symantec Corporation, Mountain View, CA (US)

(72) Inventors: Christopher Gaul, San Jose, CA (US); Michel Billard, Sunnyvale, CA (US); Paul Roybal, San Jose, CA (US)

(73) Assignee: Symantec Corporation, Mountain View, CA (US)

( * ) Notice: Subject to any disclaimer, the term of this patent is extended or adjusted under 35 U.S.C. 154(b) by 4 days.

(21) Appl. No.: 15/836,902

(22) Filed: Dec. 10, 2017

(51) Int. Cl.
*H01Q 1/24* (2006.01)
*H05K 7/20* (2006.01)
*H01Q 1/52* (2006.01)
*H01Q 1/02* (2006.01)
*H01Q 1/22* (2006.01)

(52) U.S. Cl.
CPC ........... *H05K 7/20154* (2013.01); *H01Q 1/02* (2013.01); *H01Q 1/22* (2013.01); *H01Q 1/526* (2013.01)

(58) Field of Classification Search
CPC ...... H05K 7/20154; H01Q 1/22; H01Q 1/526; H01Q 1/02
USPC .......................................................... 343/702
See application file for complete search history.

(56) References Cited

U.S. PATENT DOCUMENTS

| | | | |
|---|---|---|---|
| 7,256,996 B2 * | 8/2007 | Egbert ............... | H05K 7/20154 165/185 |
| D795,232 S | 8/2017 | Billard | |
| 9,802,279 B2 * | 10/2017 | Han ........................ | B23P 15/26 |
| 2016/0329632 A1 * | 11/2016 | Caratelli .................. | H01Q 1/48 |
| 2017/0013534 A1 * | 1/2017 | Bellis ..................... | H04W 40/16 |
| 2017/0063101 A1 * | 3/2017 | Sultenfuss ............ | F28D 1/0472 |
| 2018/0045388 A1 * | 2/2018 | McDowell .............. | F21V 29/15 |

OTHER PUBLICATIONS https://www.techrepublic.com/article/google-wifi-wireless-routerthe-smart-persons-guide/.

* cited by examiner

*Primary Examiner* — Jean B Jeanglaude
(74) *Attorney, Agent, or Firm* — FisherBroyles, LLP

(57) ABSTRACT

The disclosed wireless router may include (i) an enclosure, (ii) an antenna, (iii) a printed circuit board assembly, (iv) a radiative heat sink disposed between the antenna and the printed circuit board assembly within the wireless router such that the radiative heat sink is configured to shield the antenna from spurious emissions generated by the printed circuit board assembly, and (v) a fan disposed at a center of the radiative heat sink such that the fan is configured to cool the wireless router by circulating air within the enclosure rather than pushing air through venting in the enclosure. Various other apparatuses, systems, and methods are also disclosed.

20 Claims, 5 Drawing Sheets

APPARATUSES, SYSTEMS, AND METHODS FOR COOLING WIRELESS ROUTERS

BACKGROUND

The consumer market for wireless routers is saturated with hundreds of popular models from dozens of manufacturers. In order to stand out from the competition, a wireless router may benefit from having a unique industrial design (ID). Nevertheless, a compact and aesthetically pleasing unique ID may pose the following challenge for designers. Specifically, the challenge lies in creating a dense mechanical architecture that will fit the necessary components within the compact enclosure without sacrificing performance.

Two important elements to the performance of a wireless router are the range and throughput of the radios. Range is the distance at which an endpoint can maintain a connection to the wireless router. Throughput is the rate at which data is transferred over this connection.

Range is directly proportional to the clarity of the signal transmitted by the antennas. The electronics in the wireless router also emit low-level, spurious radio waves that can destructively interfere with the antenna signal. Some wireless routers reduce this interference by placing the antennas far away from the printed circuit board assembly (PCBA). Nevertheless, it may not always be possible to achieve such distances between the antennas and the PCBAs with a compact and unique ID, as discussed above.

Additionally, heat transfer has a big impact on throughput. The radio processors in a wireless router will throttle back throughput if they get too hot, to avoid overheating the silicon. To avoid this, some wireless routers accelerate heat transfer away from the radio processors by using natural convection of air to transfer the heat out of the enclosure through venting holes. Nevertheless, venting holes may not always be consistent with a compact and unique ID, as further discussed above. Consequently, one wishing to manufacture an aesthetically pleasing wireless router with a compact ID needs to be innovative in the design of the mechanical architecture, specifically as it relates to radio range and throughput. The instant disclosure, therefore, identifies and addresses a need for improved apparatuses, systems, and methods for cooling wireless routers.

SUMMARY

As will be described in greater detail below, the instant disclosure describes various apparatuses, systems, and methods for cooling wireless routers. In one example, a wireless router may include (i) an enclosure, (ii) an antenna, (iii) a printed circuit board assembly, (iv) a radiative heat sink disposed between the antenna and the printed circuit board assembly within the wireless router such that the radiative heat sink is configured to shield the antenna from spurious emissions generated by the printed circuit board assembly, and (v) a fan disposed at a center of the radiative heat sink such that the fan is configured to cool the wireless router by circulating air within the enclosure rather than pushing air through venting in the enclosure.

In some examples, the enclosure substantially lacks venting. In further examples, the enclosure is substantially air impermeable.

In some examples, the fan is configured to cool the wireless router through forced convection. In further examples, the wireless router is configured to perform cooling primarily through forced convection rather than natural convection.

In some examples, the wireless router includes a temperature sensor. In further examples, the wireless router is configured to activate the fan in response to the temperature sensor detecting a temperature over a threshold value.

In some examples, the radiative heat sink is separated from the enclosure by a gap of space to inhibit the radiative heat sink from heating the enclosure. In further examples, the gap of space surrounds a horizontal planar edge of the radiative heat sink.

In some examples, the radiative heat sink substantially fills a horizontal plane of the wireless router to maximize surface area of the radiative heat sink. In further examples, the radiative heat sink is disposed between the antenna and the printed circuit board assembly along a vertical axis of the wireless router.

In some examples, the radiative heat sink is placed within a horizontal plane within the enclosure that is substantially optimized in circumference to maximize surface area of the radiative heat sink. In further examples, the radiative heat sink includes at least one fin. In additional examples, the fin extends vertically up from a horizontal plane of the radiative heat sink. In even further examples, the fin extends radially along a horizontal plane from the fan at the center of the wireless router. Moreover, in some examples, the radiative heat sink includes multiple fins, and each of the multiple fins extends radially along a horizontal plane from the fan at the center of the wireless router.

In some examples, a shape of the enclosure is substantially spherical. In further examples, a shape of the enclosure forms a geodesic polyhedron.

A corresponding wireless router cooling system may include (i) a radiative heat sink disposed between an antenna and a printed circuit board assembly such that the radiative heat sink is configured to shield the antenna from spurious emissions generated by the printed circuit board assembly, and (ii) a fan disposed at a center of the radiative heat sink such that the wireless router cooling system is configured to perform cooling primarily through forced convection rather than natural convection.

A corresponding method may include (i) disposing a radiative heat sink between an antenna and a printed circuit board assembly within a wireless router such that the radiative heat sink is configured to shield the antenna from spurious emissions generated by the printed circuit board assembly, and (ii) disposing a fan at a center of the radiative heat sink such that the fan is configured to cool the wireless router by circulating air within an enclosure of the wireless router rather than pushing air through venting in the enclosure.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the instant disclosure.

Figure 1:
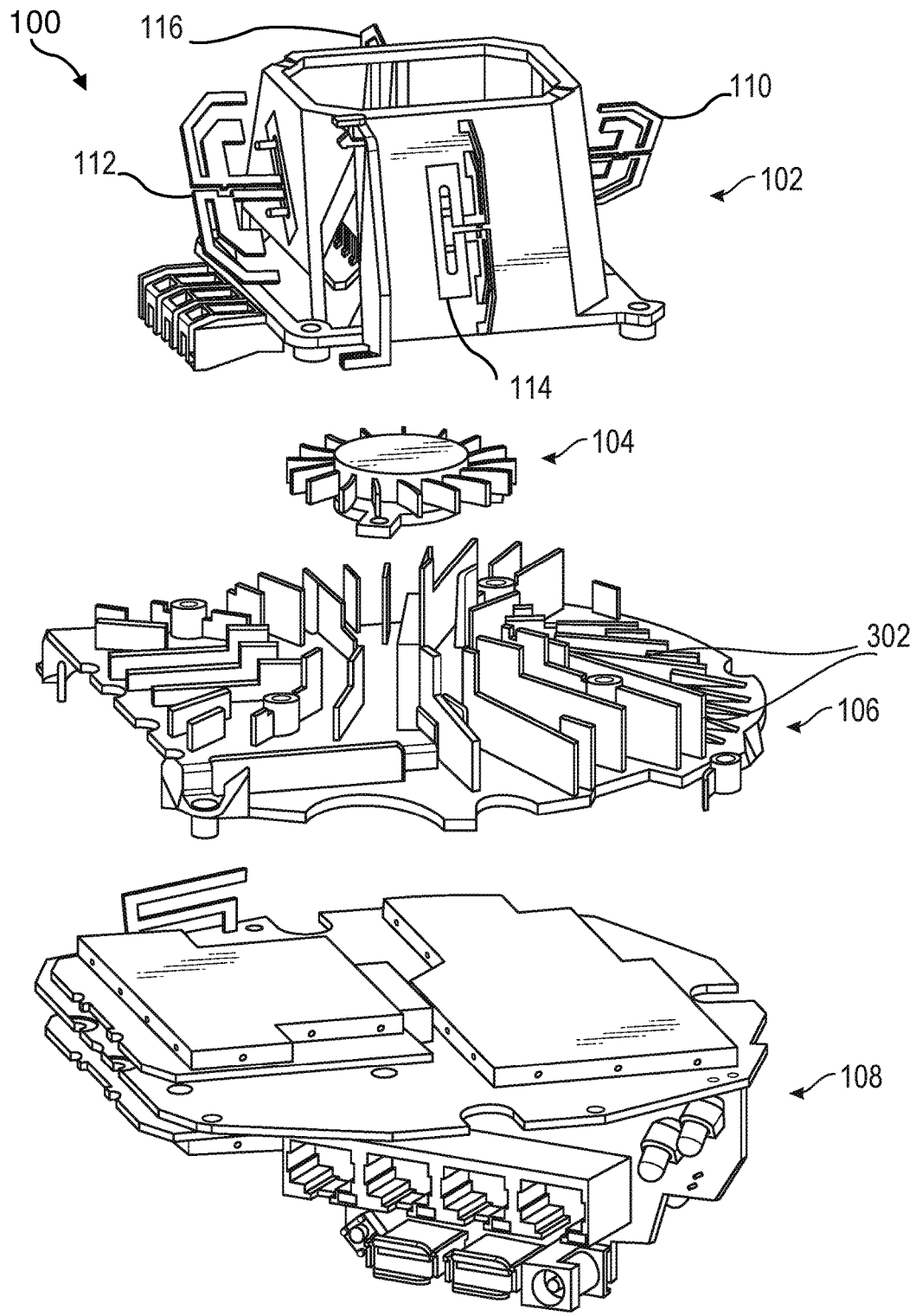
FIG. 1 shows an exploded view of a wireless router configuration.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the instant disclosure covers all modifications, equivalents, and alternatives falling within the scope of the appended claims.

DETAILED DESCRIPTION OF EXAMPLE EMBODIMENTS

The present disclosure is generally directed to apparatuses, systems, and methods for cooling wireless routers. The disclosed subject matter may improve upon related wireless routers by enabling a compact, streamlined, spherical, and/or aesthetically pleasing enclosure shape, while optionally omitting venting. The disclosed subject matter may achieve these features while also achieving interference shielding and/or electronics cooling benefits, as discussed further below.

The following will provide, with reference to FIGS. 1-4, detailed descriptions of example wireless routers that may achieve one or more of the benefits described above. Detailed descriptions of a corresponding method may be provided in connection with FIG. 5.

FIG. 1 shows an exploded view of a wireless router 100 that further includes a number of different components that are arranged in a particular manner, thereby achieving the interference shielding and/or electronics cooling benefits discussed above. In general, the wireless router 100 may perform the functions of a router and/or the functions of a wireless access point. As further shown in this figure, wireless router 100 may include an antenna tower 102, a fan 104, a radiative heat sink 106, and a printed circuit board assembly 108.

FIG. 1 further shows how antenna tower 102 may optionally include a number of antennas, including antennas 110, 112, 114, and 116. Together, antenna tower 102, including one or more of these antennas, may form an antenna assembly. The multitude of antennas may increase the gain or performance of antenna tower 102 in comparison to a single antenna.

As further shown in FIG. 1, wireless router 100 may also include a fan 104. In some examples, fan 104 may be electronically configured to dynamically switch on and off. For example, fan 104 may be configured to switch on in the case that a temperature within wireless router 100 reaches a threshold value. In these examples, wireless router 100 may further include a temperature sensor. The temperature sensor may be integrated with fan 104 and/or printed circuit board assembly 108. The temperature sensor may detect whether the temperature within wireless router 100 has reached the threshold value. In response to detecting that the temperature within wireless router 100 has reached the threshold value, wireless router 100 may dynamically switch the state of fan 104 to the "on" state. In additional or alternative examples, fan 104 may be configured to switch to one of a multitude of different "on" states, at different levels of fan speed or power, based upon the detection of a corresponding temperature threshold (e.g., satisfaction of a higher temperature threshold may trigger a higher level of fan speed or power).

As described above, fan 104 may be configured to switch on after a temperature sensor detects that the temperature within wireless router 100 has achieved a threshold value. After fan 104 switches on, fan 104 may cool wireless router 100 through forced convection, as the dominant mode of cooling, as discussed further below. In contrast, prior to fan 104 switching on, wireless router 100, including radiative heat sink 106, may cool wireless router 100 through radiation as the dominant or primary mode of cooling. More specifically, wireless router 100 may include the following combination of features, which may enable successful cooling of electronic components within wireless router 100 prior to fan 104 switching on. First, heat sink 106 may be placed in the center of wireless router 100 (e.g., at the center of a sphere or other shape of the enclosure of wireless router 100) to thereby maximize a diameter of heat sink 106. Second, heat sink 106 may be painted. A microscopic pitting in the coating may effectively increase surface area of heat sink 106. In these examples, the paint that is used to coat heat sink 106 has a higher emissivity than the metal beneath (e.g., aluminum), so the painting increases heat transfer (i.e., because rate of radiative heat transfer is directly proportional to emissivity, an inherent property of materials). Third, fins may be integrated onto heat sink 106, as shown in FIG. 1, to further increase the surface area of heat sink 106. Each of these three characteristics may improve cooling through forced convection, and also importantly improve cooling through radiation when fan 104 is switched off. FIG. 1 also shows how fan 104 is located along a central vertical axis within wireless router 100. The central vertical axis may follow through the substantial center of antenna tower 102, fan 104, radiative heat sink 106, and/or printed circuit board assembly 108. Placing fan 104 along the central vertical axis may enable fan 104 to blow air along one or more radial fins that extend vertically upward from radiative heat sink 106, as discussed further below in connection with FIG. 3. In other words, fan 104 may be configured to blow the air in a direction that is substantially radially outward from the central vertical axis of wireless router 100.

As used herein, the term of reference "vertical" refers to the vertical direction when wireless router 100 is placed with the bottom surface (i.e., the surface corresponding to the enclosure plane beneath printed circuit board assembly 108) resting on a supporting surface, in accordance with manufacturer specifications and/or labeling orientation, etc. In this example, the vertical direction will correspond to the direction or axis that traverses from antenna tower 102 through fan 104 through radiative heat sink 106 and finally through printed circuit board 108. In contrast, the horizontal direction will generally correspond to the direction of any plane that is substantially perpendicular to the vertical direction or axis. In an alternative embodiment, however, these components (i.e., antenna tower 102, fan 104, radiative heat sink 106, and printed circuit board assembly 108) are arranged in the same order along the horizontal axis.

In general, radiative heat sink 106 is disposed between antenna tower 102 and printed circuit board assembly 108. In the example of FIG. 1, radiative heat sink 106 is disposed between antenna tower 102 and printed circuit board assembly 108 along the vertical axis of the wireless router. Placing radiative heat sink 106 between antenna tower 102 and printed circuit board assembly 108 may enable radiative heat sink 106 to shield antenna tower 102 from spurious emissions generated by printed circuit board assembly 108. As used herein, the term "spurious emissions" generally refers to electromagnetic emissions, or other interference, that potentially interferes with the operation of electronic components of wireless router 100. For example, the spurious emissions may interfere with the network communications of wireless router 100 rather than enabling or contributing to these network indications. In some examples, the spurious emissions would, in the absence of the shielding by radiative heat sink 106, degrade or prevent the performance of network communication by wireless router 100.

Shielding antenna tower 102 from spurious emissions generated by printed circuit board assembly 108 may enable wireless router 100 to achieve a smaller distance between antenna tower 102 and printed circuit board assembly 108 than would otherwise be possible due to the interference of the spurious emissions (e.g., a smaller distance than the distance between these components within related wireless routers that do not dispose their heat sinks between their antennas and printed circuit board assemblies). The smaller distance between antenna tower 102 and printed circuit board assembly 108 may further enable wireless router 100 to achieve a new, unique, and/or aesthetically pleasing industrial design, such as a shape that is substantially spherical and/or a shape that forms a geodesic polyhedron, as discussed further below in connection with FIGS. 2 and 4. More specifically, the industrial design with the shape of a sphere or geodesic polyhedron may achieve a diameter that is smaller than would otherwise be possible for successful functioning of wireless router 100 without disposing radiative heat sink 106 between antenna tower 102 and printed circuit board assembly 108.

As further shown in FIG. 1, wireless router 100 may also include radiative heat sink 106. In general, radiative heat sink 106 may act as a passive heat exchanger that transfers the heat generated by an electronic or a mechanical device (i.e., printed circuit board assembly 108) to a fluid medium, which in the case of wireless router 100 may include air. Radiative heat sink 106 may be formed of a conductor, such as a metal, including optionally aluminum and/or copper.

In general, radiative heat sink 106 may be dimensioned to maximize its surface area, thereby maximizing an area over which heat may be dissipated, and thereby increasing the rate or performance of radiative heat sink 106 in dissipating heat. Accordingly, radiative heat sink 106 may be dimensioned substantially along a horizontal plane, as shown in FIG. 1. Moreover, in this example, radiative heat sink 106 may be dimensioned to substantially occupy the entirety of the horizontal plane. Additionally, radiative heat sink 106 may be disposed at a horizontal plane within wireless router 100 that is optimized, or substantially optimized, such that the horizontal plane has a maximum surface area or circumference. In the case of wireless router 100 having a sphere or geodesic polyhedron shape, radiative heat sink 106 may be placed along the horizontal plane that intersects with a substantial center of wireless router 100, thereby ensuring that the horizontal plane has a substantially maximal surface area or circumference, as further shown in FIG. 2 and discussed in more detail below. In contrast, a horizontal plane near the top or the bottom of wireless router 100 would have a smaller circumference and, therefore, would have a smaller corresponding surface area. In some examples, the surface area of radiative heat sink 106 may also be maximized by painting the surface of radiative heat sink 106.

FIG. 1 also shows how radiative heat sink 106 may include one or more fins, including the illustrative examples of fins 302. These fins may be formed of the same material as radiative heat sink 106. Radiative heat sink 106 and its fins may form an integrated construction (e.g., formed or molded as one piece) or composite construction (e.g., assembled together from separate pieces). The inclusion of these fins as part of radiative heat sink 106 may further maximize the surface area of radiative heat sink 106, as further discussed above in connection with the circumference of radiative heat sink 106. As shown in FIG. 1, one or more of these fins may optionally have a substantially planar shape, while extending vertically upward. Moreover, one or more of these fins may also be oriented to extend in a substantially radial direction along a horizontal plane from fan 104 at the center of wireless router 100 (i.e., at the horizontal center of wireless router 100).

Figure 3:
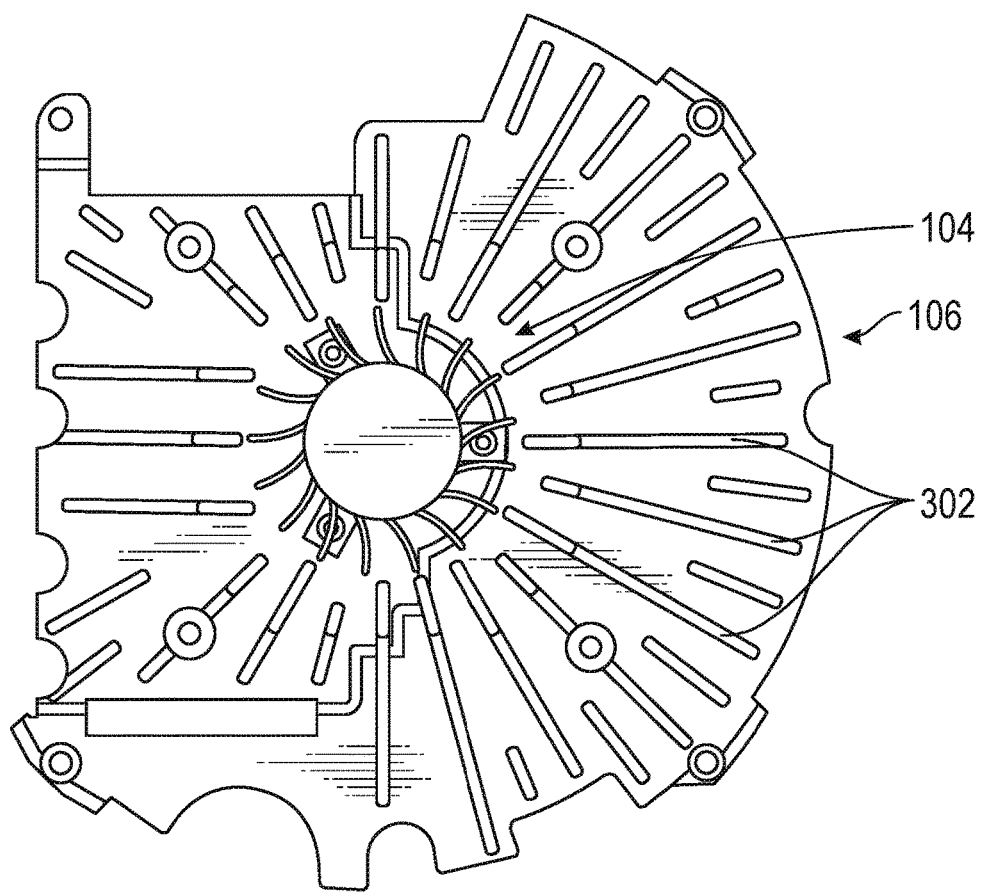
FIG. 3 shows a plan view of a cooling fan.

FIG. 3 further shows a plan view of fan 104 that illustrates how each of the fins of radiative heat sink 106 are optionally oriented radially outward from the substantial center of radiative heat sink 106, where fan 104 is located. Orienting the fins of radiative heat sink 106 radially outward from the center of radiative heat sink 106 enables these fins to guide the air that fan 104 blows radially outward from the center of the radiative heat sink 106, thereby further achieving cooling through forced convection, as discussed further below. More specifically, orienting the fins of radiative heat sink 106 radially outward from the center of radiative heat sink 106 enables the fins to guide the air that fan 104 blows over the surface area of the fins, thereby increasing the surface area of radiative heat sink 106 over which the air comes into contact, and thereby further increasing heat dissipation. The radial direction of the fins as part of radiative heat sink 106 also increases the uniformity of the airflow emanating from fan 104 over the top surface of radiative heat sink 106, thereby spreading the airflow more uniformly over the entire top surface of radiative heat sink 106.

FIG. 1 also shows how wireless router 100 includes printed circuit board assembly 108. In general, printed circuit board assembly 108 may include some, all, or substantially all, of the active electronic components of wireless router 100. The example of FIG. 1 further shows how printed circuit board assembly 108 may include connected or integrated ETHERNET and/or USB connection ports.

Regarding printed circuit board assembly 108, wireless router 100 may optionally have one or more of the following characteristics. Wireless router 100 may include one or more network interface cards integrated into a main system on a chip that is disposed on printed circuit board assembly 108. The network interface card may support FASTER ETHERNET or GIGABIT ETHERNET. Wireless router 100 may include one or more wireless network interface controllers supporting one or more versions of the IEEE 802.11-standard family, including IEEE 802.11n. The wireless network interface controller may be integrated into the main system on a chip or as a separate chip on printed circuit board assembly 108. The wireless network interface controller may optionally form a distinct card that is connected over a MINIPCI or MINIPCIE interface.

Wireless router 100 may also include an ETHERNET switch supporting GIGABIT ETHERNET or FAST ETHERNET, with support for IEEE 802.1Q, integrated into the main system on a chip or as a separate chip on printed circuit board assembly 108. Wireless router 100 may also optionally include one or more of an xDSL modem, a DOCSIS modem, an LTE modem, or fiber optic modem. In some examples, wireless router 100 may include a dual-band wireless router that operates at the 2.4 GHz and 5 GHz bands simultaneously. In some specific examples, wireless router 100 may have data transfer rates of potentially 300 Mbit/s (for 2.4 GHz band) and 450 Mbit/s (for 5 GHz band).

In some examples, wireless router 100 may include a Wi-Fi "clone" button that simplifies wireless network configuration and builds a seamless unified home network, which may optionally enable SUPER RANGE EXTENSION. According to SUPER RANGE EXTENSION functionality, wireless router 100 may automatically copy a service set identifier and/or password used to connect to wireless router 100.

In some examples, wireless router 100 may include one or more USB ports, as further shown in the example of FIG. 1. Some wireless routers have one or two USB ports. In the case of a wireless router having a single USB port, the USB port may optionally be designated for either printer or desktop/mobile external hard disk drive usage. In the case of a wireless router having multiple USB ports, one may optionally be designated for a printer, and the other may be designated for the desktop or mobile external hard disk drive usage.

Figure 2:
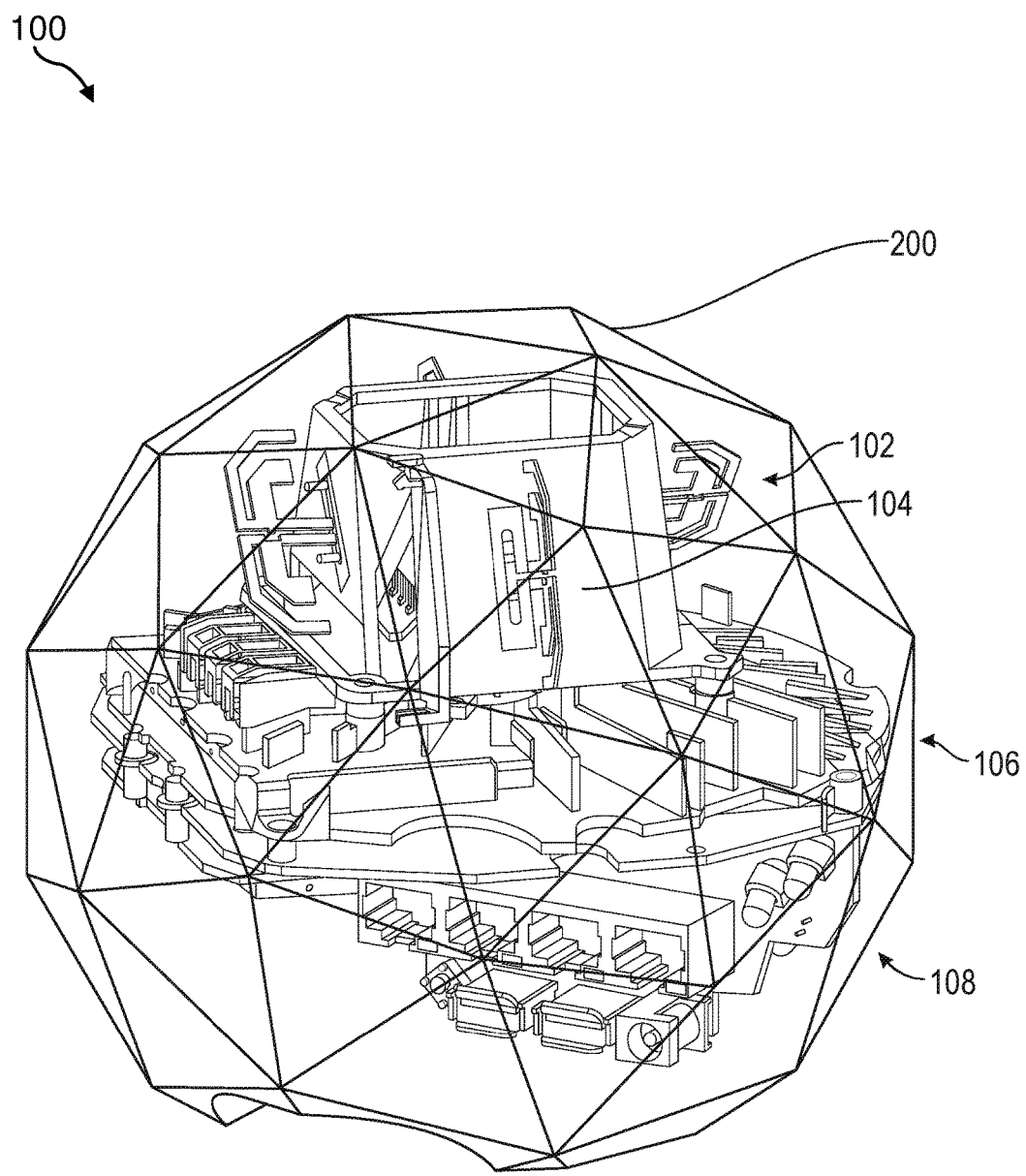
FIG. 2 shows another view of the wireless router configuration after assembly.

FIG. 2 shows a view of the configuration of wireless router 100 after assembly in contrast to the exploded view of FIG. 1. As further shown in this figure, wireless router 100 may include an enclosure 200. In FIG. 2, enclosure 200 is translucent to further illustrate the internal components of wireless router 100. In general, as used herein, the term "enclosure" refers to the external surface or outer construction of wireless router 100. Enclosure 200 may provide the new, unique, streamlined, compact, and/or aesthetically pleasing industrial design that is further discussed above. For example, enclosure 200 may form a shape that is substantially spherical and/or the substantial shape of a geodesic polyhedron, which is further shown in FIG. 2.

In general, fan 104, which is optionally disposed at a center of radiative heat sink 106, is configured to cool wireless router 100 by circulating air within enclosure 200 rather than pushing air through venting in the enclosure. As used herein, the phrase "rather than pushing air through venting in the enclosure" generally refers to the performance of cooling without cooling being achieved through significant transmission of air from inside of the enclosure 200 to the outside of enclosure 200 (e.g., through venting). In some of these examples, enclosure 200 substantially lacks venting. In further examples, enclosure 200 may be substantially air impermeable. For example, enclosure 200 may lack any venting holes. Alternatively, enclosure 200 may simply lack a number of venting holes that is sufficiently high to enable significant cooling through venting. The lack of substantial venting may prevent wireless router 100 from performing cooling through natural convection, as in related or conventional wireless router configurations, in which case heat transport is achieved without an external source, such as fan 104. In contrast, fan 104 may be configured to cool wireless router 100 through forced convection rather than natural convection (e.g., using forced convection as a primary source of cooling rather than using natural convection as the primary source). The omission of venting and the corresponding omission of cooling through natural convection, and the substitution of forced convection for natural convection, may enable enclosure 200 to achieve a sleeker, more streamlined, more elegant, and/or more market-receptive industrial design (e.g., one without substantial venting), as discussed further above.

As used herein, the term "substantial venting" generally refers to venting that is sufficiently spacious to cool wireless router 100 sufficiently to maintain successful operation of the electronic components of wireless router 100. Accordingly, the term "substantial venting" generally does not refer to a trivial amount of venting that does not significantly contribute to the cooling of wireless router 100.

FIG. 2 also illustrates how radiative heat sink 106 may optionally be separated from enclosure 200 by a gap of space to inhibit radiative heat sink 106 from heating enclosure 200. Preventing or inhibiting radiative heat sink 106 from heating enclosure 200 may ensure that wireless router 100 is tactilely pleasant to touch without overheating. The gap of space may surround a horizontal planar edge of radiative heat sink 106, as further shown in FIG. 2. In some examples, radiative heat sink 106 may be dimensioned to substantially fill the circumference along the horizontal plane within enclosure 200, without entirely filling the circumference, such that radiative heat sink 106 substantially maximizes surface area along the horizontal plane but does not actually contact enclosure 200 and provide a physical connection for the dissipation of heat. Instead, radiative heat sink 106 may be dimensioned to substantially fill the circumference while still maintaining at least a narrow gap of space between radiative heat sink 106 and enclosure 200. In some examples, the gap of space may follow the entire circumference of radiative heat sink 106 and the corresponding circumference of enclosure 200 along the same horizontal plane (e.g., analogous to a moat surrounding a castle).

Figure 4:
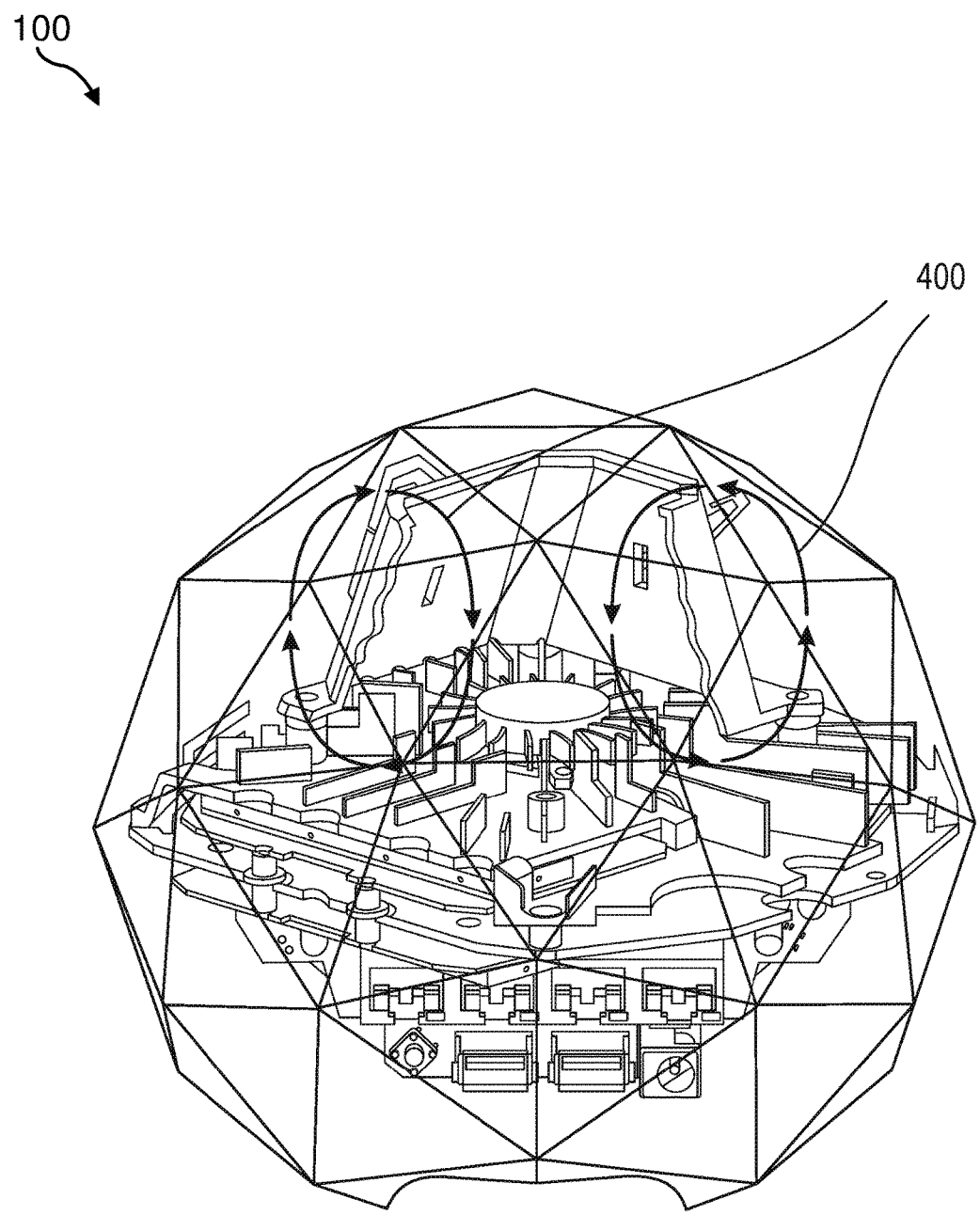
FIG. 4 shows another perspective view of the wireless router configuration that further illustrates the circulation of air within an enclosure of the wireless router.

FIG. 4 shows another perspective view of wireless router 100. As further shown in this figure, fan 104 may itself include fins that rotate around a center of fan 104 to thereby blow air within enclosure 200. Specifically, FIG. 4 illustrates how the activation of fan 104 may circulate air within enclosure 200 in the direction of one or more of arrows 400. In these embodiments, cooling of electronics within wireless router 100 is achieved through forced convection that dissipates heat through the blowing of the air by fan 104. More specifically, in some examples, fan 104 may simply circulate air within wireless router 100 rather than pushing the air, or any significant or substantial amount of air, through enclosure 200 to the exterior of wireless router 100. In fact, as further outlined above, enclosure 200 may be substantially air impermeable and/or lack substantial venting, which may achieve a new, unique, more elegant, and/or more streamlined industrial design.

In view of the above, wireless router 100 may rely upon the forced convection achieved by fan 104 circulating air within enclosure 200 to effectively cool the electronics of wireless router 100 and maintain successful operation of its electronic components without substantial degradation, or failure, due to overheating. Accordingly, the substitution of forced convection causing purely (or substantially purely) internal circulation of air by fan 104, for natural convection (which is common to related or conventional wireless routers), may effectively overcome the problem of cooling wireless router 100 when natural convection and/or enclosure venting are unavailable due to design constraints or preferences, as further discussed above. Moreover, the overall design of wireless router 100, and its ordered arrangement of antenna tower 102, fan 104, radiative heat sink 106, and printed circuit board assembly 108, as discussed above, may achieve successful cooling of the electronic components, while further achieving a sleek and aesthetically pleasing industrial design, while also further achieving a smaller diameter or more compact size by disposing radiative heat sink 106 between antenna tower 102 and printed circuit board assembly 108, thereby shielding antenna tower 102 from spurious emissions generated by printed circuit board assembly 108.

Figure 5:
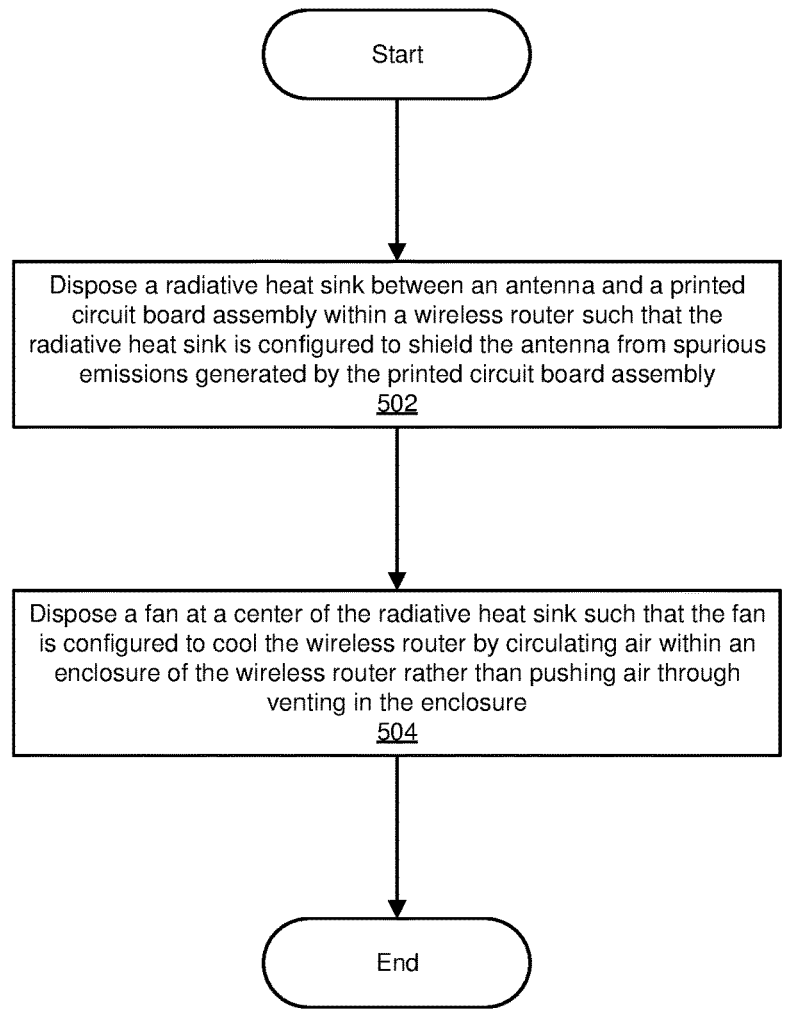
FIG. 5 shows a flow diagram of an example method for cooling wireless routers.

FIG. 5 shows a flow diagram of an example method 500 for cooling wireless routers. The steps shown in FIG. 5 may be performed by an individual and/or by any suitable manual and/or automated apparatus.

At step 502 in FIG. 5, a radiative heat sink may be disposed between an antenna and a printed circuit board assembly within a wireless router such that the radiative heat sink is configured to shield the antenna from spurious emissions generated by the printed circuit board assembly. For example, radiative heat sink 106 may be disposed between antenna tower 102 and printed circuit board assembly 108 within wireless router 100 such that radiative heat sink 106 is configured to shield antenna tower 102 from spurious emissions generated by printed circuit board assembly 108.

Radiative heat sink 106 may be disposed between antenna tower 102 and printed circuit board assembly 108 using any suitable human labor and/or automated machinery. In general, a manufacturer of wireless routers may dispose radiative heat sink 106 between antenna tower 102 and printed circuit board assembly 108 at a factory or other location for constructing wireless router 100. In general, radiative heat sink 106 may be dimensioned, in terms of size, to be sufficiently large to shield antenna tower 102 from spurious emissions sufficiently to preserve or maintain successful operation of the electronics of wireless router 100.

At step 504 in FIG. 5, a fan may be disposed at a center of the radiative heat sink such that the fan is configured to cool the wireless router by circulating air within an enclosure of the wireless router rather than pushing air through venting in the enclosure. For example, fan 104 may be disposed at a center of radiative heat sink 106 such that fan 104 is configured to cool wireless router 100 by circulating air within enclosure 200 of wireless router 100 rather than pushing air through venting in enclosure 200. Fan 104 may be disposed at the center of radiative heat sink 106 as part of the construction of wireless router 100, as further discussed above in parallel to step 502.

As outlined above, the disclosed subject matter may improve upon related wireless routers by enabling a compact, streamlined, spherical, and/or aesthetically pleasing enclosure shape, while optionally omitting venting. The disclosed subject matter may achieve these features while also achieving interference shielding and/or electronics cooling benefits, as discussed in more detail above.

The foregoing description, for purposes of explanation, has been described with reference to specific embodiments and has been provided to enable others skilled in the art to best utilize various aspects of the example embodiments disclosed herein. However, the illustrative discussions above are not intended to be exhaustive or to limit the scope of the claims to the precise forms disclosed. Many modifications and variations are possible in view of the above teachings without departing from the spirit and scope of the instant disclosure. In addition, any disclosure of components contained within other components should be considered example in nature since many other architectures can be implemented to achieve the same functionality. The instant disclosure covers all modifications, equivalents, and alternatives falling within the scope of the appended claims. Features from any of the above-mentioned embodiments may be used in combination with one another in accordance with the general principles described herein. The embodiments were chosen to best explain the principles underlying the claims and their practical applications, to thereby enable others skilled in the art to best use the embodiments with various modifications as are suited to the particular uses contemplated. The embodiments disclosed herein should be considered in all respects illustrative and not restrictive. Reference should be made to the appended claims and their equivalents in determining the scope of the instant disclosure.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It will also be understood that, although the terms first, second, primary, etc. are, in some instances, used herein to describe various elements, these elements should not be limited by these terms. These terms are used only to distinguish one element from another. For example, a first segment could be termed a second segment, and, similarly, a second segment could be termed a first segment, without departing from the scope of the various described embodiments. The first segment and the second segment are both segments, but they are not the same segment.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise noted, the terms "connected to," "coupled to," and "attached to" (and their derivatives), as used in the specification and claims, are to be construed as permitting both direct and indirect (i.e., via other elements or components) connection. Furthermore, two or more elements may be coupled together with an adhesive, a clasp, a latch, a hook, a link, a buckle, a bolt, a screw, a rivet, a snap, a catch, a lock, or any other type of fastening or connecting mechanism.

What is claimed is:

1. A wireless router comprising:
   an enclosure;
   an antenna;
   a printed circuit board assembly;
   a radiative heat sink disposed between the antenna and the printed circuit board assembly within the wireless router such that the radiative heat sink is configured to shield the antenna from spurious emissions generated by the printed circuit board assembly; and
   a fan disposed at a center of the radiative heat sink such that the fan is configured to cool the wireless router by circulating air within the enclosure rather than pushing air through venting in the enclosure.

2. The wireless router of claim 1, wherein the enclosure substantially lacks venting.

3. The wireless router of claim 2, wherein the enclosure is substantially air impermeable.

4. The wireless router of claim 1, wherein the fan is configured to cool the wireless router through forced convection.

5. The wireless router of claim 4, wherein the wireless router is configured to perform cooling primarily through forced convection rather than natural convection.

6. The wireless router of claim 1, further comprising a temperature sensor.

7. The wireless router of claim 6, wherein the wireless router is configured to activate the fan in response to the temperature sensor detecting a temperature over a threshold value.

8. The wireless router of claim 1, wherein the radiative heat sink is separated from the enclosure by a gap of space to inhibit the radiative heat sink from heating the enclosure.

9. The wireless router of claim 8, wherein the gap of space surrounds a horizontal planar edge of the radiative heat sink.

10. The wireless router of claim 1, wherein the radiative heat sink substantially fills a horizontal plane of the wireless router to maximize surface area of the radiative heat sink.

11. The wireless router of claim 1, wherein the radiative heat sink is disposed between the antenna and the printed circuit board assembly along a vertical axis of the wireless router.

12. The wireless router of claim 1, wherein the radiative heat sink is placed within a horizontal plane within the enclosure that is substantially optimized in circumference to maximize surface area of the radiative heat sink.

13. The wireless router of claim 1, wherein the radiative heat sink comprises at least one fin.

14. The wireless router of claim 13, wherein the fin extends vertically up from a horizontal plane of the radiative heat sink.

15. The wireless router of claim 13, wherein the fin extends radially along a horizontal plane from the fan at the center of the wireless router.

16. The wireless router of claim 13, wherein:
the radiative heat sink comprises a plurality of fins; and
each of the plurality of fins extends radially along a horizontal plane from the fan at the center of the wireless router.

17. The wireless router of claim 1, wherein a shape of the enclosure is substantially spherical.

18. The wireless router of claim 17, wherein a shape of the enclosure forms a geodesic polyhedron.

19. A wireless router cooling system, comprising:
a radiative heat sink disposed between an antenna and a printed circuit board assembly such that the radiative heat sink is configured to shield the antenna from spurious emissions generated by the printed circuit board assembly; and
a fan disposed at a center of the radiative heat sink such that the wireless router cooling system is configured to perform cooling primarily through forced convection rather than natural convection.

20. A method comprising:
disposing a radiative heat sink between an antenna and a printed circuit board assembly within a wireless router such that the radiative heat sink is configured to shield the antenna from spurious emissions generated by the printed circuit board assembly; and
disposing a fan at a center of the radiative heat sink such that the fan is configured to cool the wireless router by circulating air within an enclosure of the wireless router rather than pushing air through venting in the enclosure.

* * * * *